United States Patent
Zhao et al.

(10) Patent No.: US 9,989,611 B2
(45) Date of Patent: Jun. 5, 2018

(54) SYSTEMS AND METHODS FOR IMAGE RECONSTRUCTION USING VARIABLE-DENSITY SPIRAL TRAJECTORY

(71) Applicant: University of Virginia Patent Foundation, Charlottesville, VA (US)

(72) Inventors: Li Zhao, Charlottesville, VA (US); Craig H. Meyer, Charlottesville, VA (US)

(73) Assignee: University of Virginia Patent Foundation, Charlottesville, VA (US)

( * ) Notice: Subject to any disclaimer, the term of this patent is extended or adjusted under 35 U.S.C. 154(b) by 615 days.

(21) Appl. No.: 14/677,877

(22) Filed: Apr. 2, 2015

(65) Prior Publication Data

US 2015/0316630 A1 Nov. 5, 2015

Related U.S. Application Data

(60) Provisional application No. 61/974,243, filed on Apr. 2, 2014.

(51) Int. Cl.
*G01V 3/00* (2006.01)
*G01R 33/561* (2006.01)
*G01R 33/48* (2006.01)

(52) U.S. Cl.
CPC ...... *G01R 33/5611* (2013.01); *G01R 33/4818* (2013.01); *G01R 33/4824* (2013.01)

(58) Field of Classification Search
USPC .......................................................... 324/309
See application file for complete search history.

(56) References Cited

U.S. PATENT DOCUMENTS

| | | | | |
|---|---|---|---|---|
| 4,651,096 A | * | 3/1987 | Buonocore | G01R 33/4824 324/307 |
| 6,020,739 A | * | 2/2000 | Meyer | G01R 33/4824 324/300 |
| 6,239,598 B1 | * | 5/2001 | Zhang | G01R 33/58 324/307 |
| 6,362,621 B1 | * | 3/2002 | Miyamoto | G01R 33/3852 324/309 |

(Continued)

OTHER PUBLICATIONS

Adcock, B. et al., "Breaking the coherence barrier: A new theory for compressed sensing," arXiv.org, Feb. 2014, version 3, Cornell University.

(Continued)

*Primary Examiner* — Rodney Fuller
(74) *Attorney, Agent, or Firm* — Meunier Carlin & Curfman LLC

(57) ABSTRACT

In image reconstruction using a variable-density spiral trajectory, a method includes acquiring magnetic resonance (MR) data, which includes determining a multi-level under-sampling pattern based on sampling distance and probability functions, and determining a desired variable-density spiral trajectory based on the undersampling pattern. Acquiring the MR data also includes generating spiral gradient waveforms based on the desired trajectory, and tracing a variable-density spiral trajectory using the spiral gradient waveforms. After tracing, the MR data can be sub-sampled based on the variable-density spiral trajectory. One or more images can be reconstructed based on the acquired MR data.

41 Claims, 8 Drawing Sheets

(56) References Cited

U.S. PATENT DOCUMENTS

| | | | | |
|---|---|---|---|---|
| 2005/0077895 A1* | 4/2005 | Hargreaves | ............ | G01R 33/561 |
| | | | | 324/307 |
| 2009/0143668 A1* | 6/2009 | Harms | ................... | A61B 5/055 |
| | | | | 600/410 |
| 2011/0044524 A1* | 2/2011 | Wang | ..................... | G01R 33/54 |
| | | | | 382/131 |
| 2015/0346303 A1* | 12/2015 | Hu | ..................... | G01R 33/5601 |
| | | | | 600/420 |

OTHER PUBLICATIONS

Adcock, B. et al., "Breaking the coherence barrier: A new theory for compressed sensing," arXiv.org, Jun. 2014, version 4, Cornell University.

Guerquin-Kern, M. et al., "Realistic Analytical Phantoms for Parallel Magnetic Resonance Imaging," IEEE Trans Med Imaging, 2012, pp. 626-636, 31(3), IEEE.

Lustig, M. et al., "Faster Imaging with Randomly Perturbed, Undersampled Spirals and |L|_1 Reconstruction," Proc. Intl Soc Mag Reson Med., 2005, p. 685, 13.

Lustig, M. et al., "Sparse MRI: The Application of Compressed Sensing for Rapid MR Imaging," Magn Reson Med., 2007, pp. 1182-1195, 58(6), Wiley-Liss, Inc.

Qing, K. et al., "Acquisition of Spatially-registered Helium-3 and Proton 3D Image Sets of the Lung in less than 10 seconds using Compressed Sensing," Proc. Intl Soc Mag Reson Med., 2011, p. 546, 19.

Zhang, T. et al., "Fast Pediatric 3D Free-Breathing Abdominal Dynamic Contrast Enhanced MRI With High Spatiotemporal Resolution," J Magn Reson Imaging, 2015, pp. 460-473, 41(2), Wiley Periodicals, Inc.

\* cited by examiner

SYSTEMS AND METHODS FOR IMAGE RECONSTRUCTION USING VARIABLE-DENSITY SPIRAL TRAJECTORY

CROSS-REFERENCE TO RELATED APPLICATION

This application claims priority to and benefit under 35 U.S.C § 119(e) of U.S. Provisional Patent Application Ser. No. 61/974,243, entitled "Sampling Pattern Design for 2D Compressed Sensing using a Multilevel Variable-density Spiral Trajectory," filed Apr. 2, 2014, which is hereby incorporated by reference in its entirety as if fully set forth below.

Some references, which may include patents, patent applications, and various publications, are cited in a reference list and discussed in the disclosure provided herein. The citation and/or discussion of such references is provided merely to clarify the description of the present disclosure and is not an admission that any such reference is "prior art" to any aspects of the present disclosure described herein. All references cited and discussed in this specification are incorporated herein by reference in their entireties and to the same extent as if each reference was individually incorporated by reference. In terms of notation, hereinafter, "[n]" may represent the nth reference cited in the reference list. For example, [5] represents the 5th reference cited in the reference list, namely, Lustig et al. ISMRM 2005; 685.

STATEMENT OF RIGHTS UNDER FEDERALLY-SPONSORED RESEARCH

This invention was made with government support under grant R01 HL079110, awarded by the National Institutes of Health. The government has certain rights in the invention.

BACKGROUND

Compressed sensing ("CS"), an acceleration technique of growing importance in magnetic resonance imaging ("MRI"), can be used to reconstruct high-quality images from data sampled well below the Nyquist rate. To improve accuracy and decrease data acquisition time, the choice of sampling pattern is an important design element in CS. Variable-density random k-space sampling patterns are particularly effective for three-dimensional ("3D") Cartesian sampling, where there is flexibility in choosing ky and kz phase encoding positions [1, 2]. The design of two-dimensional ("2D") sampling patterns of high acceleration is more challenging.

Adcock et al. recently developed a framework that describes MRI as both asymptomatically sparse and asymptomatically incoherent, and using this framework they designed an optimal multilevel random sub-sampling scheme [3]. While helpful in bridging the gap between existing CS theory and real-world application, the sub-sampling scheme in Adcock may be limited in its application to 2D CS MRI with high acceleration.

It is with respect to these and other considerations that the various embodiments described below are presented.

SUMMARY

The present disclosure relates generally to MRI, and more particularly to systems and methods for sampling two-dimensional ("2D") CS MRI with high acceleration using a variable-density spiral trajectory.

In one aspect, a method for data sampling and image reconstruction is disclosed. In one exemplary embodiment, the method may include acquiring magnetic resonance ("MR") data corresponding to an area of interest of a subject. Acquiring the MR data may include determining a 2D multi-level undersampling pattern based on a distance, $r_k$, between each sampling point of a plurality of sampling points in k-space and a center of the k-space, and a probability that each of the sampling points is acquired. After determining the multi-level undersampling pattern, a desired variable-density spiral trajectory may be determined based on the multi-level undersampling pattern. The desired variable-density spiral trajectory may have a density as according to a function of $r_k$. Acquiring the MR data may also include generating one or more spiral gradient waveforms based on the desired variable-density trajectory, and tracing a variable-density spiral trajectory using the one or more spiral gradient waveforms. After tracing, the MR data may be sub-sampled based on the variable-density spiral trajectory. The method may also include reconstructing, using one or more image reconstruction functions that include compressed sensing, one or more images of the area of interest based on the acquired MR data.

In a further aspect, another method for image reconstruction is disclosed. In one exemplary embodiment, the method may include acquiring MR data corresponding to an area of interest of a subject. Acquiring the MR data may include determining a multi-level undersampling pattern based on a distance between each sampling point of a plurality of sampling points in k-space and a center of the k-space, and a probability that each of the sampling points is acquired. After determining the multi-level undersampling pattern, a desired variable-density spiral trajectory may be determined based on the multi-level undersampling pattern. Acquiring the MR data may also include generating one or more spiral gradient waveforms based on the desired variable-density trajectory, and tracing a variable-density spiral trajectory using the one or more spiral gradient waveforms. After tracing, the MR data may be sub-sampled based on the variable-density spiral trajectory. The method may also include reconstructing one or more images of the area of interest based on the acquired MR data.

In another aspect, a system for image reconstruction is disclosed. In one exemplary embodiment, the system may include a data collection device configured to acquire MR data corresponding to an area of interest of a subject. The data collection device may include an undersampling determination module configured to determine a 2D multi-level undersampling pattern based on a distance, $r_k$, between each sampling point of a plurality of sampling points in k-space and a center of the k-space, and a probability that each of the sampling points is acquired. The data collection device may also include a trajectory determination module configured to determine a desired variable-density spiral trajectory based on the multi-level undersampling pattern. The desired variable-density spiral trajectory may have a density as according to a function of $r_k$. The data collection device may also have a generating module configured to generate one or more spiral gradient waveforms based on the desired variable-density trajectory. The data collection device may also have a tracing module configured to trace a variable-density spiral trajectory using the one or more spiral gradient waveforms. Further, the data collection device may have a sampling module configured to sub-sample the MR data based on the variable-density spiral trajectory. The system may also include an image processing device coupled to the data collection device. The image processing device may be configured to reconstruct, using one or more image reconstruction functions that include compressed sensing, one or more images of the area of interest based on the acquired MR data.

In yet another aspect, a non-transitory computer-readable medium is disclosed. In one example embodiment, the non-transitory computer-readable medium may have stored computer-executable instructions that, when executed by one or more processors, cause a computer to perform functions that include acquiring MR data corresponding to an area of interest of a subject. Acquiring the MR data may also include determining a multi-level undersampling pattern based on a distance between each sampling point of a plurality of sampling points in k-space and a center of the k-space, and a probability that each of the sampling points is acquired. After determining the multi-level undersampling pattern, a desired variable-density spiral trajectory may be determined based on the multi-level undersampling pattern. Acquiring the MR data may include generating one or more spiral gradient waveforms based on the desired variable-density trajectory, and tracing a variable-density spiral trajectory using the one or more spiral gradient waveforms. After tracing, the MR data may be sub-sampled based on the variable-density spiral trajectory. The performed functions may also include reconstructing one or more images of the area of interest based on the acquired MR data.

Other aspects and features according to the present disclosure will become apparent to those of ordinary skill in the art, upon reviewing the following detailed description in conjunction with the accompanying figures.

DETAILED DESCRIPTION

Figure 1:
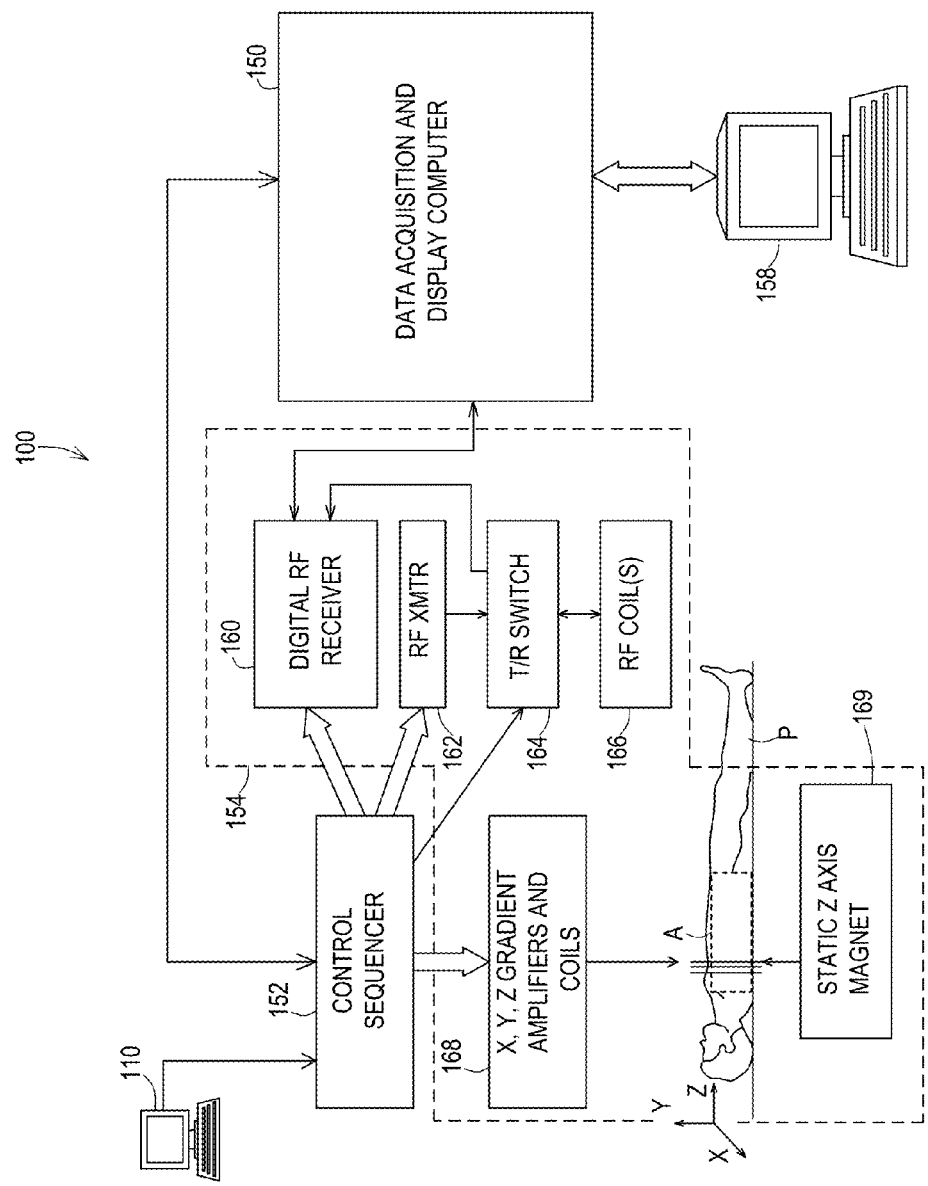
FIG. 1 is a system diagram illustrating an imaging system capable of implementing aspects of the present disclosure in accordance with one or more exemplary embodiments.

Aspects of the present disclosure relate to magnetic resonance imaging ("MRI"), specifically systems and methods for image reconstruction using a variable-density spiral trajectory. Among other benefits and advantages, practicing aspects of the present disclosure in accordance with one or more example embodiments described herein can provide a sampling pattern configured for two-dimensional ("2D") compressed sensing ("CS") MRI with high acceleration using a variable-density spiral trajectory.

Although example embodiments of the present disclosure are explained in detail, it is to be understood that other embodiments are contemplated. Accordingly, it is not intended that the present disclosure be limited in its scope to the details of construction and arrangement of components set forth in the following description or illustrated in the drawings. The present disclosure is capable of other embodiments and of being practiced or carried out in various ways.

It must also be noted that, as used in the specification and the appended claims, the singular forms "a," "an" and "the" include plural referents unless the context clearly dictates otherwise.

Ranges may be expressed herein as from "about" or "approximately" one particular value and/or to "about" or "approximately" another particular value. When such a range is expressed, other exemplary embodiments include from the one particular value and/or to the other particular value.

By "comprising" or "containing" or "including" is meant that at least the named compound, element, particle, or method step is present in the composition or article or method, but does not exclude the presence of other compounds, materials, particles, method steps, even if the other such compounds, material, particles, method steps have the same function as what is named.

In describing example embodiments, terminology will be resorted to for the sake of clarity. It is intended that each term contemplates its broadest meaning as understood by those skilled in the art and includes all technical equivalents that operate in a similar manner to accomplish a similar purpose.

It is also to be understood that the mention of one or more steps of a method does not preclude the presence of additional method steps or intervening method steps between those steps expressly identified. Steps of a method may be performed in a different order than those described herein without departing from the scope of the present disclosure. Similarly, it is also to be understood that the mention of one or more components in a device or system does not preclude the presence of additional components or intervening components between those components expressly identified.

Further, it is contemplated that one or more data acquisition or data collection steps of a method may include acquiring, collecting, receiving, or otherwise obtaining data. By way of example, data acquisition or collection may include acquiring data via a data acquisition device, receiving data from an on-site or off-site data acquisition device or from another data collection, storage, or processing device. Similarly, data acquisition or data collection devices of a system may include any device configured to acquire, collect, or otherwise obtain data, or to receive data from a data acquisition device within the system, an independent data acquisition device located on-site or off-site, or another data collection, storage, or processing device.

As discussed herein, a "subject" or "patient" may be a human or any animal. It should be appreciated that an animal may be a variety of any applicable type, including, but not limited thereto, mammal, veterinarian animal, livestock animal or pet type animal, etc. As an example, the animal may be a laboratory animal specifically selected to have certain characteristics similar to a human (e.g. rat, dog, pig, monkey), etc. It should be appreciated that the subject may be any applicable human patient, for example.

In one aspect, a method for data sampling and image reconstruction is disclosed. In one exemplary embodiment, the method may include acquiring magnetic resonance ("MR") data corresponding to an area of interest of a subject. Acquiring the MR data may include determining a 2D multi-level undersampling pattern based on a distance, $r_k$, between each sampling point of a plurality of sampling points in k-space and a center of the k-space, and a probability that each of the sampling points is acquired. After determining the multi-level undersampling pattern, a desired variable-density spiral trajectory may be determined based on the multi-level undersampling pattern. The desired variable-density spiral trajectory may have a density as according to a function of $r_k$. Acquiring the MR data may also include generating one or more spiral gradient waveforms based on the desired variable-density trajectory, and tracing a variable-density spiral trajectory using the one or more spiral gradient waveforms. After tracing, the MR data may be sub-sampled based on the variable-density spiral trajectory. The method may also include reconstructing, using one or more image reconstruction functions that include compressed sensing, one or more images of the area of interest based on the acquired MR data.

In some embodiments, the method may further include determining a characteristic of a physiological activity in the area of interest of the subject based on the one or more reconstructed images. In one embodiment, the physiological activity may include a dynamic physiological activity. In another embodiment, the area of interest of the subject may include a brain. In yet another embodiment, the area of interest of the subject may include a heart.

In some embodiments, acquiring the magnetic resonance data may further include receiving experimental image data from a scanner having a single-channel coil.

In other embodiments, sub-sampling the magnetic resonance data may include pseudo-undersampling the magnetic resonance data at about 10 percent or greater. For example, in one embodiment, sub-sampling the magnetic resonance data may include pseudo-undersampling the magnetic resonance data at about 12.4 percent.

In some embodiments, sub-sampling the magnetic resonance data may include densely sampling the k-space proximate the center of the k-space, and sparsely sampling the k-space proximate one or more edges of the k-space.

In a further aspect, another method for image reconstruction is disclosed. In one exemplary embodiment, the method may include acquiring MR data corresponding to an area of interest of a subject. Acquiring the MR data may include determining a multi-level undersampling pattern based on a distance between each sampling point of a plurality of sampling points in k-space and a center of the k-space, and a probability that each of the sampling points is acquired. After determining the multi-level undersampling pattern, a desired variable-density spiral trajectory may be determined based on the multi-level undersampling pattern. Acquiring the MR data may also include generating one or more spiral gradient waveforms based on the desired variable-density trajectory, and tracing a variable-density spiral trajectory using the one or more spiral gradient waveforms. After tracing, the MR data may be sub-sampled based on the variable-density spiral trajectory. The method may also include reconstructing one or more images of the area of interest based on the acquired MR data.

In some embodiments, the method may also include determining a characteristic of a physiological activity in the area of interest of the subject based on the one or more reconstructed images. In one embodiment, the physiological activity may include a dynamic physiological activity. In another embodiment, the area of interest of the subject may include at least one of the brain and the heart of the subject. In yet another embodiment, reconstructing the one or more images may include using one or more image reconstruction functions that comprise compressed sensing. In another embodiment, the multi-level undersampling pattern may be a 2D multi-level undersampling pattern.

In other embodiments, acquiring the MR data may also include receiving experimental image data from a scanner having a single-channel coil.

In some embodiments, sub-sampling the MR data may include pseudo-undersampling the magnetic resonance data at about 10 percent or greater. For example, in one embodiment, sub-sampling the MR data may include pseudo-undersampling the magnetic resonance data at about 12.4 percent.

In other embodiments, sub-sampling the MR data may include densely sampling the k-space proximate the center of the k-space, and sparsely sampling the k-space proximate one or more edges of the k-space.

In some embodiments, the desired variable-density spiral trajectory may have a density as according to a function of the distance between each sampling point of the plurality of sampling points in k-space and the center of the k-space.

In another aspect, a system for image reconstruction is disclosed. In one exemplary embodiment, the system may include a data collection device configured to acquire MR data corresponding to an area of interest of a subject. The data collection device may include an undersampling determination module configured to determine a 2D multi-level undersampling pattern based on a distance, $r_k$, between each sampling point of a plurality of sampling points in k-space and a center of the k-space, and a probability that each of the sampling points is acquired. The data collection device may also include a trajectory determination module configured to determine a desired variable-density spiral trajectory based on the multi-level undersampling pattern. The desired variable-density spiral trajectory may have a density as according to a function of $r_k$. The data collection device may also have a generating module configured to generate one or more spiral gradient waveforms based on the desired variable-density trajectory. The data collection device may also have a tracing module configured to trace a variable-density spiral trajectory using the one or more spiral gradient waveforms. Further, the data collection device may have a sampling module configured to sub-sample the MR data based on the variable-density spiral trajectory. The system may also include an image processing device coupled to the data collection device. The image processing device may be configured to reconstruct, using one or more image reconstruction functions that include compressed sensing, one or more images of the area of interest based on the acquired MR data.

In some embodiments, the data collection device may include an MRI device configured to acquire the MR data.

In other embodiments, the image processing device may include at least one processor configured to execute computer-readable instructions to cause a computing device to perform functions comprising acquiring the magnetic resonance data and reconstructing the one or more images.

In some embodiments, the image processing device or another system device may be further configured to determine a characteristic of a physiological activity in the area of interest of the subject based on the one or more reconstructed images. In one embodiment, the physiological activity may include a dynamic physiological activity. In another embodiment, the area of interest of the subject may include at least one of the brain and the heart of the subject. In yet another embodiment, reconstructing the one or more images may include using one or more image reconstruction functions that comprise compressed sensing. In another embodiment, the multi-level undersampling pattern may be a 2D multi-level undersampling pattern.

In other embodiments, acquiring the MR data may also include receiving experimental image data from a scanner having a single-channel coil.

In some embodiments, sub-sampling the MR data may include pseudo-undersampling the magnetic resonance data at about 10 percent or greater. For example, in one embodiment, sub-sampling the MR data may include pseudo-undersampling the magnetic resonance data at about 12.4 percent.

In other embodiments, sub-sampling the MR data may include densely sampling the k-space proximate the center of the k-space, and sparsely sampling the k-space proximate one or more edges of the k-space.

In some embodiments, the desired variable-density spiral trajectory may have a density as according to a function of the distance between each sampling point of the plurality of sampling points in k-space and the center of the k-space.

In yet another aspect, a non-transitory computer-readable medium is disclosed. In one example embodiment, the non-transitory computer-readable medium may have stored computer-executable instructions that, when executed by one or more processors, cause a computer to perform functions that include acquiring MR data corresponding to an area of interest of a subject. Acquiring the MR data may also include determining a multi-level undersampling pattern based on a distance between each sampling point of a plurality of sampling points in k-space and a center of the k-space, and a probability that each of the sampling points is acquired. After determining the multi-level undersampling pattern, a desired variable-density spiral trajectory may be determined based on the multi-level undersampling pattern. Acquiring the MR data may include generating one or more spiral gradient waveforms based on the desired variable-density trajectory, and tracing a variable-density spiral trajectory using the one or more spiral gradient waveforms. After tracing, the MR data may be sub-sampled based on the variable-density spiral trajectory. The performed functions may also include reconstructing one or more images of the area of interest based on the acquired MR data.

In some embodiments, the instructions, when executed by the processor(s), may also cause the computer to determine a characteristic of a physiological activity in the area of interest of the subject based on the one or more reconstructed images. In one embodiment, the physiological activity may include a dynamic physiological activity. In another embodiment, the area of interest of the subject may include at least one of the brain and the heart of the subject. In yet another embodiment, reconstructing the one or more images may include using one or more image reconstruction functions that comprise compressed sensing. In another embodiment, the multi-level undersampling pattern may be a 2D multi-level undersampling pattern.

In other embodiments, acquiring the MR data may also include receiving experimental image data from a scanner having a single-channel coil.

In some embodiments, sub-sampling the MR data may include pseudo-undersampling the magnetic resonance data at about 10 percent or greater. For example, in one embodiment, sub-sampling the MR data may include pseudo-undersampling the magnetic resonance data at about 12.4 percent.

In other embodiments, sub-sampling the MR data may include densely sampling the k-space proximate the center of the k-space, and sparsely sampling the k-space proximate one or more edges of the k-space.

In some embodiments, the desired variable-density spiral trajectory may have a density as according to a function of the distance between each sampling point of the plurality of sampling points in k-space and the center of the k-space.

In the following description, references are made to the accompanying drawings that form a part hereof and that show, by way of illustration, specific embodiments or examples. In referring to the drawings, like numerals represent like elements throughout the several figures.

FIG. 1 is a system diagram illustrating an operating environment capable of implementing aspects of the present disclosure in accordance with one or more example embodiments. FIG. 1 is a system diagram illustrating an operating environment capable of implementing aspects of the present disclosure in accordance with one or more example embodiments. FIG. 1 illustrates an example of a magnetic resonance imaging (MRI) system 100, including a data acquisition and display computer 150 coupled to an operator console 110, an MRI real-time control sequencer 152, and an MRI subsystem 154. The MRI subsystem 154 may include XYZ magnetic gradient coils and associated amplifiers 168, a static Z-axis magnet 169, a digital RF transmitter 162, a digital RF receiver 160, a transmit/receive switch 164, and RF coil(s) 166. The MRI subsystem 154 may be controlled in real time by control sequencer 152 to generate magnetic and radio frequency fields that stimulate magnetic resonance phenomena in a living subject, patient P, to be imaged. A contrast-enhanced image of an area of interest A of the patient P may be shown on display 158. The display 158 may be implemented through a variety of output interfaces, including a monitor, printer, or data storage.

The area of interest A corresponds to a region associated with one or more physiological activities in patient P. The area of interest shown in the example embodiment of FIG. 1 corresponds to a chest region of patient P, but the area of interest for purposes of implementing aspects of the disclosure presented herein is not limited to the chest area. It should be recognized and appreciated that the area of interest can be one or more of a brain region, heart region, and upper or lower limb regions of the patient P, for example. Physiological activities that may be analyzed by methods and systems in accordance with various embodiments of the present disclosure may include, but are not limited to, muscular movement or fluid flow in particular areas of interest.

It should be appreciated that any number and type of computer-based medical imaging systems or components, including various types of commercially available medical imaging systems and components, may be used to practice aspects of the present disclosure. The scope of the disclosure is not intended to be specifically limited to MRI implementations or the particular system shown in FIG. 1.

One or more data acquisition or data collection steps as described herein in accordance with one or more embodiments may include acquiring, collecting, receiving, or otherwise obtaining data such as imaging data corresponding to an area of interest. By way of example, data acquisition or collection may include acquiring data via a data acquisition device, receiving data from an on-site or off-site data acquisition device or from another data collection, storage, or processing device. Similarly, data acquisition or data collection devices of a system in accordance with one or more embodiments of the present disclosure may include any device configured to acquire, collect, or otherwise obtain data, or to receive data from a data acquisition device within the system, an independent data acquisition device located on-site or off-site, or another data collection, storage, or processing device.

Figure 2:
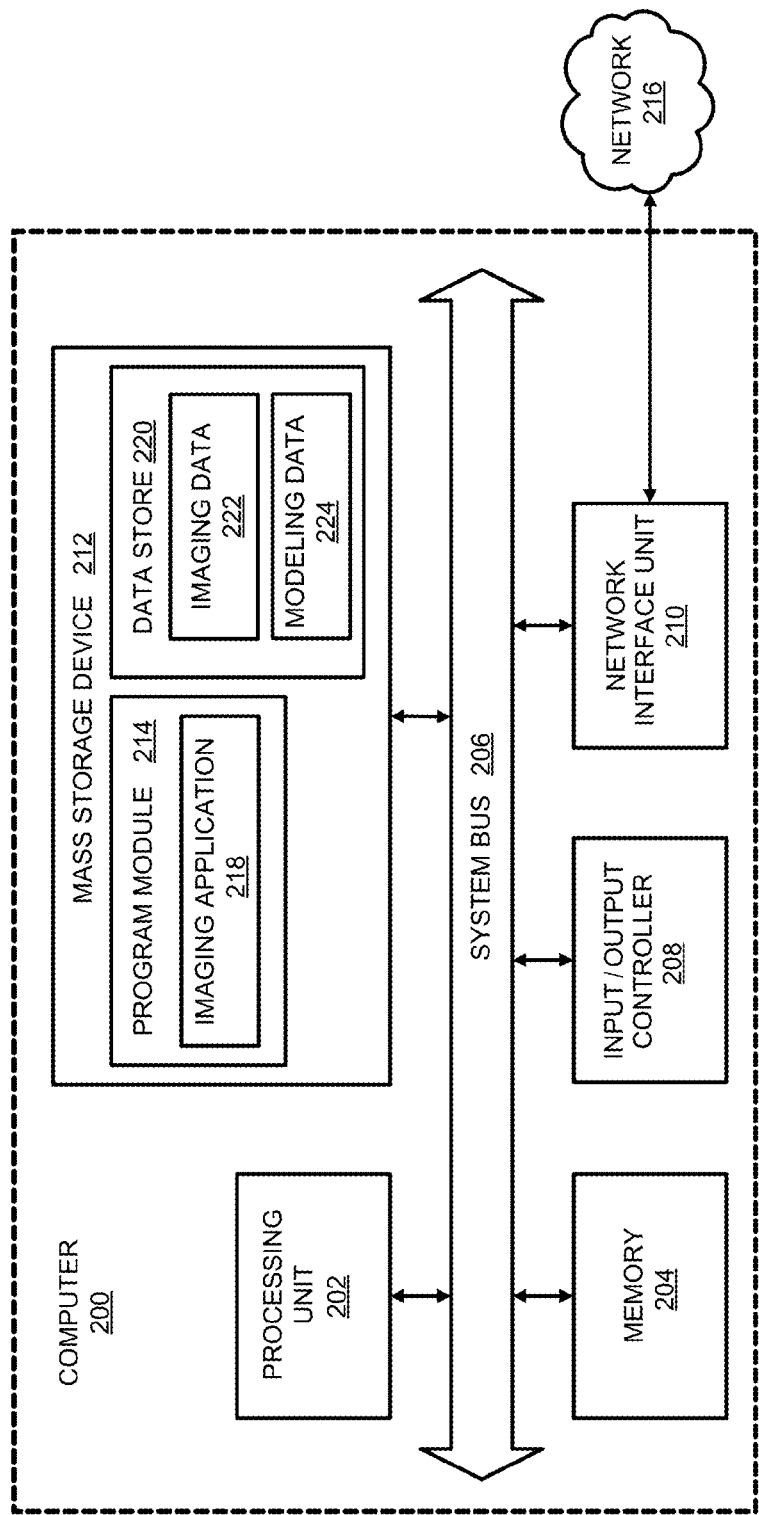
FIG. 2 is a computer architecture diagram showing a general computing system capable of implementing aspects of the present disclosure in accordance with one or more exemplary embodiments.

FIG. 2 is a computer architecture diagram showing a general computing system capable of implementing aspects of the present disclosure in accordance with one or more example embodiments described herein. A computer 200 may be configured to perform one or more functions associated with embodiments illustrated in one or more of FIGS. 3 and 4. For example, the computer 200 may be configured to perform one or more of steps of a disclosed method for image reconstruction. It should be appreciated that the computer 200 may be implemented within a single computing device or a computing system formed with multiple connected computing devices. The computer 200 may be configured to perform various distributed computing tasks, which may distribute processing and/or storage resources among the multiple devices. The data acquisition and display computer 150 and/or operator console 110 of the system shown in FIG. 1 may include one or more systems and components of the computer 200.

As shown, the computer 200 includes a processing unit 202 ("CPU"), a system memory 204, and a system bus 206 that couples the memory 204 to the CPU 202. The computer 200 further includes a mass storage device 212 for storing program modules 214. The program modules 214 may be operable to perform one or more functions associated with embodiments illustrated in one or more of FIGS. 3 and 4 discussed above. The program modules 214 may include an imaging application 218 for handling image data acquisition, receipt, and/or processing, or for directing an imaging device in communication with the computer to acquire and/or send image data. The computer 200 can include a data store 220 for storing data that may include imaging-related data 222 such as acquired image data, and a modeling data store 224 for storing image modeling data, or other various types of data utilized in practicing aspects of the present disclosure.

The mass storage device 212 is connected to the CPU 202 through a mass storage controller (not shown) connected to the bus 206. The mass storage device 212 and its associated computer-storage media provide non-volatile storage for the computer 200. Although the description of computer-storage media contained herein refers to a mass storage device, such as a hard disk or CD-ROM drive, it should be appreciated by those skilled in the art that computer-storage media can be any available computer storage media that can be accessed by the computer 200.

By way of example, and not limitation, computer-storage media (also referred to herein as "computer-readable storage medium" or "computer-readable storage media") may include volatile and non-volatile, removable and non-removable media implemented in any method or technology for storage of information such as computer-storage instructions, data structures, program modules, or other data. For example, computer storage media includes, but is not limited to, RAM, ROM, EPROM, EEPROM, flash memory or other solid state memory technology, CD-ROM, digital versatile disks ("DVD"), HD-DVD, BLU-RAY, or other optical storage, magnetic cassettes, magnetic tape, magnetic disk storage or other magnetic storage devices, or any other medium which can be used to store the desired information and which can be accessed by the computer 200. Transitory signals are not "computer-storage media", "computer-readable storage medium" or "computer-readable storage media" as described herein.

According to various embodiments, the computer 200 may operate in a networked environment using connections to other local or remote computers through a network 216 via a network interface unit 210 connected to the bus 206. The network interface unit 210 may facilitate connection of the computing device inputs and outputs to one or more suitable networks and/or connections such as a local area network (LAN), a wide area network (WAN), the Internet, a cellular network, a radio frequency network, a Bluetooth-enabled network, a Wi-Fi enabled network, a satellite-based network, or other wired and/or wireless networks for communication with external devices and/or systems. The computer 200 may also include an input/output controller 208 for receiving and processing input from a number of input devices. Input devices may include one or more of keyboards, mice, stylus, touchscreens, microphones, audio capturing devices, or image/video capturing devices. An end user may utilize such input devices to interact with a user interface, for example a graphical user interface, for managing various functions performed by the computer 200.

The bus 206 may enable the processing unit 202 to read code and/or data to/from the mass storage device 212 or other computer-storage media. The computer-storage media may represent apparatus in the form of storage elements that are implemented using any suitable technology, including but not limited to semiconductors, magnetic materials, optics, or the like. The computer-storage media may represent memory components, whether characterized as RAM, ROM, flash, or other types of technology. The computer-storage media may also represent secondary storage, whether implemented as hard drives or otherwise. Hard drive implementations may be characterized as solid state, or may include rotating media storing magnetically-encoded information. The program modules 214, which include the imaging application 218, may include instructions that, when loaded into the processing unit 202 and executed, cause the computer 200 to provide functions associated with embodiments illustrated in FIGS. 3 and 4. The program modules 214 may also provide various tools or techniques by which the computer 200 may participate within the overall systems or operating environments using the components, flows, and data structures discussed throughout this description.

In general, the program modules 214 may, when loaded into the processing unit 202 and executed, transform the processing unit 202 and the overall computer 200 from a general-purpose computing system into a special-purpose computing system. The processing unit 202 may be constructed from any number of transistors or other discrete circuit elements, which may individually or collectively assume any number of states. More specifically, the processing unit 202 may operate as a finite-state machine, in response to executable instructions contained within the program modules 214. These computer-executable instructions may transform the processing unit 202 by specifying how the processing unit 202 transitions between states, thereby transforming the transistors or other discrete hardware elements constituting the processing unit 202.

Encoding the program modules 214 may also transform the physical structure of the computer-storage media. The specific transformation of physical structure may depend on various factors, in different implementations of this description. Examples of such factors may include, but are not limited to the technology used to implement the computer-storage media, whether the computer storage media are characterized as primary or secondary storage, and the like. For example, if the computer-storage media are implemented as semiconductor-based memory, the program modules 214 may transform the physical state of the semiconductor memory, when the software is encoded therein. For example, the program modules 214 may transform the state of transistors, capacitors, or other discrete circuit elements constituting the semiconductor memory.

As another example, the computer-storage media may be implemented using magnetic or optical technology. In such implementations, the program modules 214 may transform the physical state of magnetic or optical media, when the software is encoded therein. These transformations may include altering the magnetic characteristics of particular locations within given magnetic media. These transformations may also include altering the physical features or characteristics of particular locations within given optical media, to change the optical characteristics of those locations. Other transformations of physical media are possible without departing from the scope of the present description, with the foregoing examples provided only to facilitate this discussion.

Figure 3:
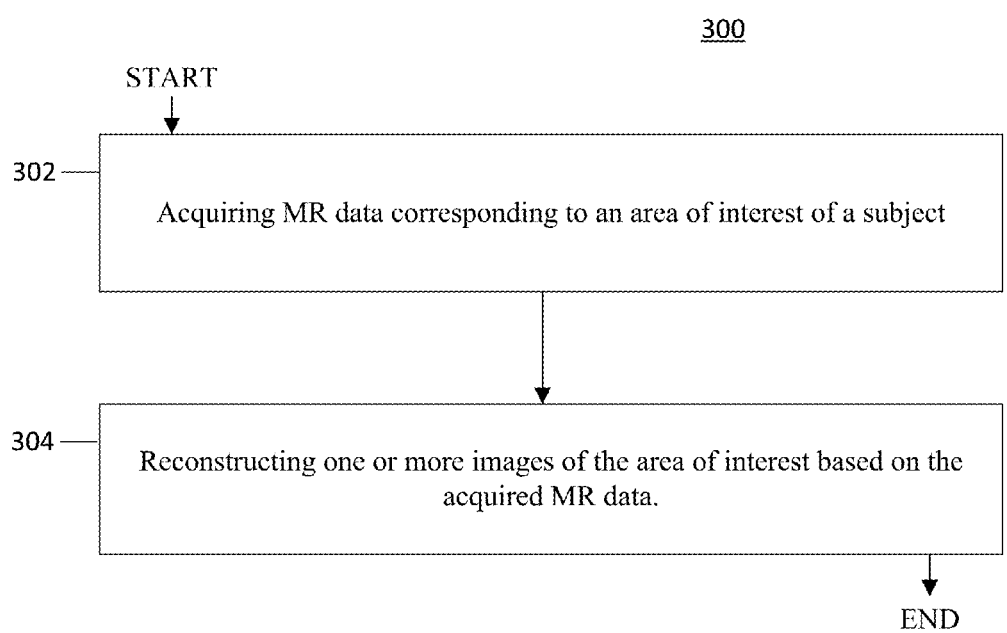
FIG. 3 is a flow diagram illustrating operations of a method for image reconstruction in accordance with one exemplary embodiment.

FIG. 3 illustrates operational steps of a method 300 for image reconstruction, according to an exemplary embodiment of the present disclosure. The method 300 may begin by acquiring MR data corresponding to an area of interest of a subject, as shown at block 302. The area of interest of the subject could include any desired object or item for imaging including, but not limited to a heart, brain, or other organs. After acquiring the MR data, one or more images of the area of interest may be reconstructed based on the acquired MR data, as shown at block 304.

Figure 4:
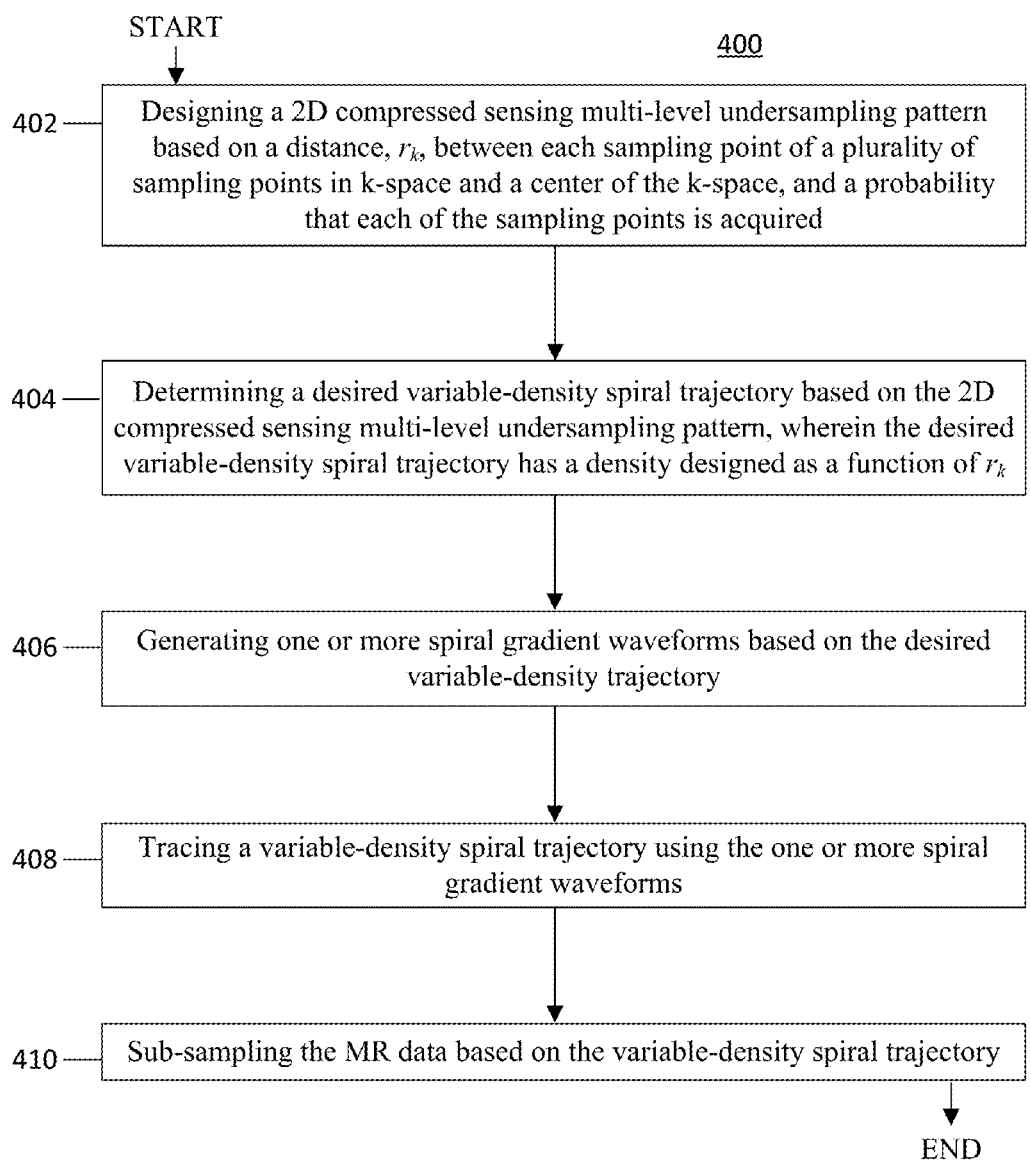
FIG. 4 is a flow diagram illustrating operations of a method for sub-sampling MR data in accordance with one exemplary embodiment.

In some embodiments, the acquisition block 302 of method 300 may include operational steps, as shown as acquisition method 400 in FIG. 4. The method 400 may include designing a 2D compressed sensing multi-level undersampling pattern based on a distance, $r_k$, between each sampling point of a plurality of sampling points in k-space and a center of the k-space, and a probability that each of the sampling points is acquired, as shown at block 402. After designing the 2D compressed sensing multi-level undersampling pattern, a desired variable-density spiral trajectory may be determined based on the undersampling pattern, as shown at block 404. The desired variable-density spiral trajectory may have a density designed as a function of $r_k$. The method 400 may also include generating one or more spiral gradient waveforms based on the desired variable-density trajectory, as shown at block 406. After generating the spiral gradient waveforms, a variable-density spiral trajectory may be traced using the spiral gradient waveforms, as shown at block 408. The method 400 may also include sub-sampling the MR data based on the variable-density spiral trajectory, as shown at block 410.

Figure 5:
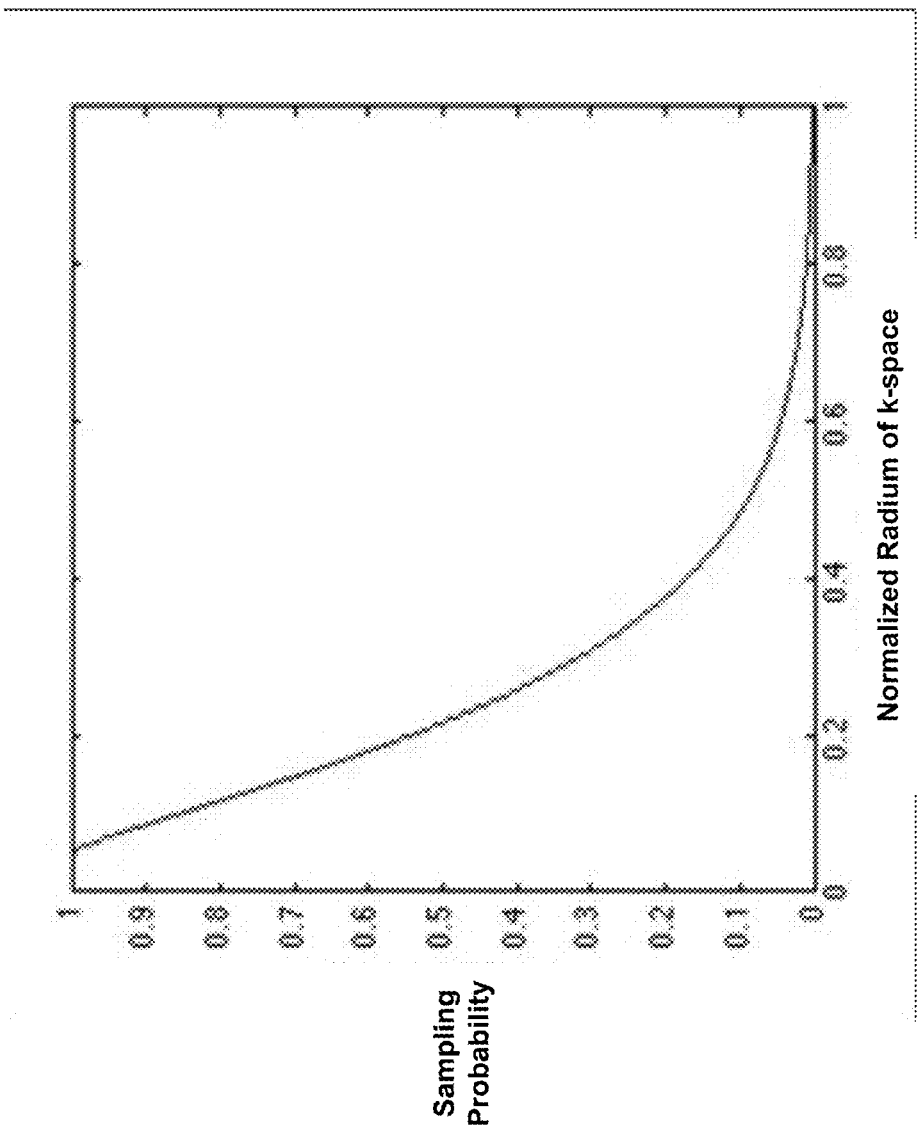
FIG. 5 is a two-dimensional graph of a sample probability function in accordance with one exemplary embodiment.

FIG. 5 illustrates a sample probability function where a sampling probability is a function of normalized radium of k-space. In some embodiments, sub-sampling the MR data may follow this sample probability function shown in FIG. 5, with the k-space being densely sampled proximate its center, and sparsely sampled approaching the edges of the k-space.

Figure 6:
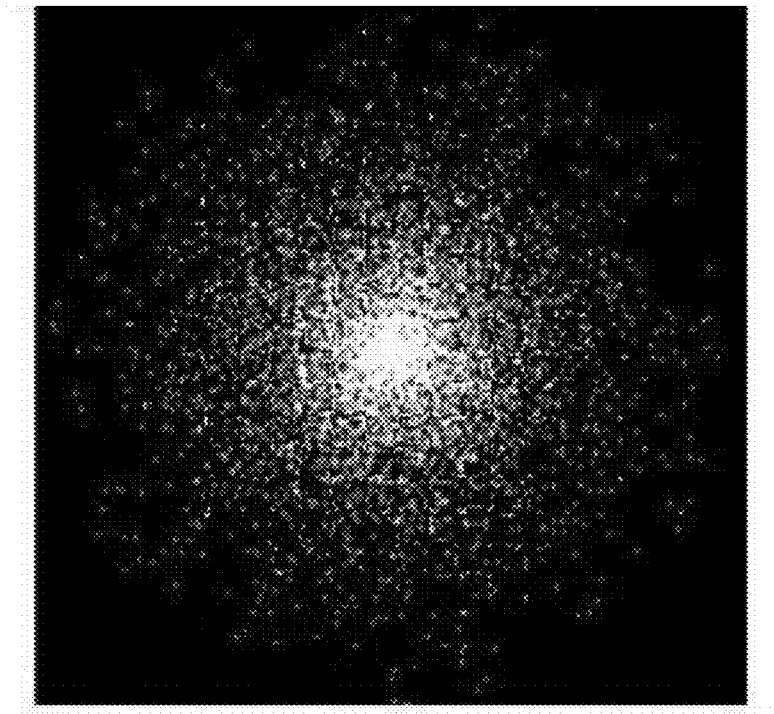
FIG. 6 is an image of an ideal 2D random undersampling pattern.

FIG. 6 illustrates an ideal 2D random undersampling pattern. In some embodiments, the density of the disclosed spiral trajectory, as a function of radius, may match or partially match the ideal random sub-sampling density.

Figure 7:
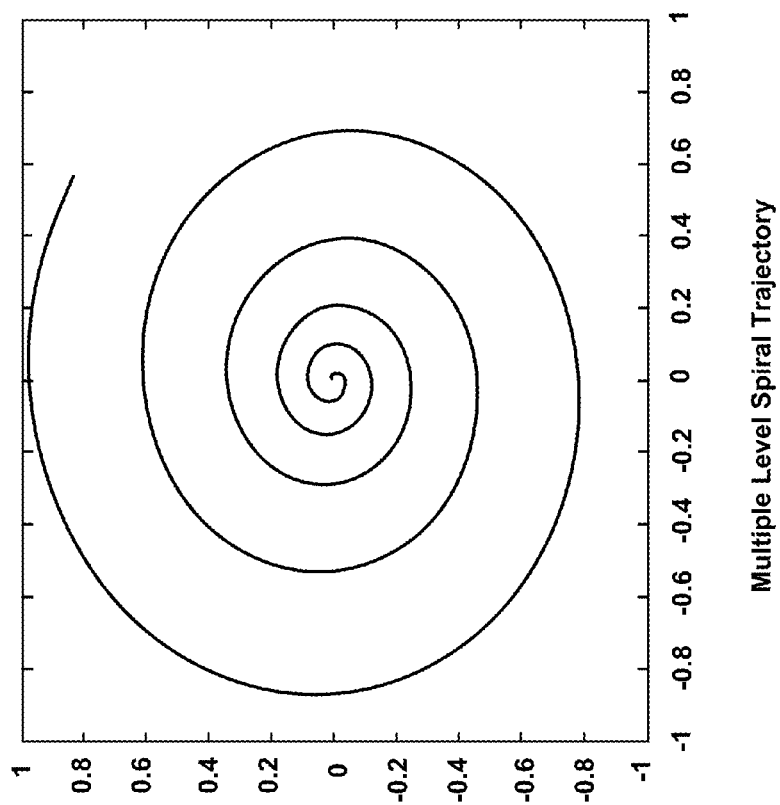
FIG. 7 is a two-dimensional graph of a multiple level spiral trajectory in accordance with one or more exemplary embodiments.

FIG. 7 illustrates an exemplary multiple level spiral trajectory, mapped in k-space. In some embodiments, the disclosed spiral trajectory may resemble FIG. 7. It is contemplated that, using the multi-level spiral trajectory, it is possible to separate k-space into N concentric circular regions. Then, by calculating a distance from a sampling point on the spiral trajectory to the center of the k-space and a sampling probability, the desired spiral trajectory can be determined, and gradients can be formed based on the desired spiral trajectory.

EXAMPLE IMPLEMENTATIONS AND RESULTS

The following describes examples of implementing some aspects of the present disclosure, and corresponding results.

Methods

Radial trajectories have shown promising results [3] using undersampling of radial spokes, resulting in a linear sampling probability function as a function of k-space radius. A similar linear undersampling scheme has been used for spiral trajectories [5]. However, linear undersampling may be suboptimal [3]. Variable-density spiral trajectories permit complete flexibility in choosing sampling density as a function of radius, and thus, are ideal for implementing multi-level random sub-sampling.

Step 1:

The multi-level strategy may separate k-space into N concentric circular regions. In designing an N-level undersampling pattern, $r_k$ is the distance between a sampling point in k-space and the center of k-space. The probability that a particular point is actually acquired is given by $p_k$. m is a constant with 0<m<1, which corresponds to a fully sampled region in the center of k-space. With these variables defined, the undersampling pattern may be governed by one or more of the following equations:

$$r_k = \begin{cases} m & \text{for } k = 0 \\ k\dfrac{1-m}{N-1} & \text{for } k = 1, \ldots, N-1 \end{cases}$$

$$p_k = \begin{cases} 1 & \text{for } k = 0 \\ \exp\left[-\left(b\dfrac{k}{N}\right)^a\right] & \text{for } k = 1, \ldots, N-1 \end{cases}$$

Due to the spiral design, a relatively large N may be used. In some embodiments, the k-space should be sampled as shown in FIG. 5. That is, the k-space may be sampled densely near its center and exponentially reduced towards the edge.

Step 2:

Using the sampling density pattern defined in Step 1, the following spiral trajectory may be used:

$$\text{traj} = Ate^{iwt}$$

In some embodiments, the density of the spiral trajectory may be defined by $\omega$. First, $\omega_0$ may be calculated for the fully sampled constant density spiral, as described in U.S. Pat. No. 6,020,739, which is incorporated herein by reference. Next, $\omega$ may be designed as a function of $r_k$, following the optimal undersampling pattern design in Step 1:

$$w(r_k) = w_0((D_0 - D_1)p_k(r_k) + D_1)$$

where $D_0$ is the normalized start density at the center of k-space. When fully sampled, $D_0=1$, which corresponds to the density of a conventional constant density spiral. $D_1$ is the normalized end density.

In some embodiments, the gradient may be designed to meet ω following the method disclosed in U.S. Pat. No. 6,020,739. Using the gradient, the multi-level spiral trajectory may be traced, and thus, identify a plurality of sampling points within k-space. Following the tracing, MR data can be sampled and used for image reconstruction.

Results

To demonstrate the performance of the exemplary spiral design, a numerical phantom [6] was used to simulate a 2D spiral acquisition. Multiple interleaves were chosen to achieve the target resolution and each interleaf was rotated by a random angle to provide incoherent sampling. A constant-density spiral trajectory sampled at the Nyquist rate was used as a reference and reconstructed using a conjugate gradient method. Experimental data was collected on a Siemens 3T Trio scanner with a single-channel coil. Data from a resolution phantom was acquired in Cartesian k-space and then pseudo-undersampled to a gridded spiral trajectory. Finally, an exemplary embodiment of the disclosed spiral trajectory was directly implemented and its performance was compared to a constant-density spiral trajectory. All undersampled data was reconstructed by a general forward-backward splitting method to exploit sparsity in total variation ("TV") and wavelet domains.

Simulations

Figure 8:
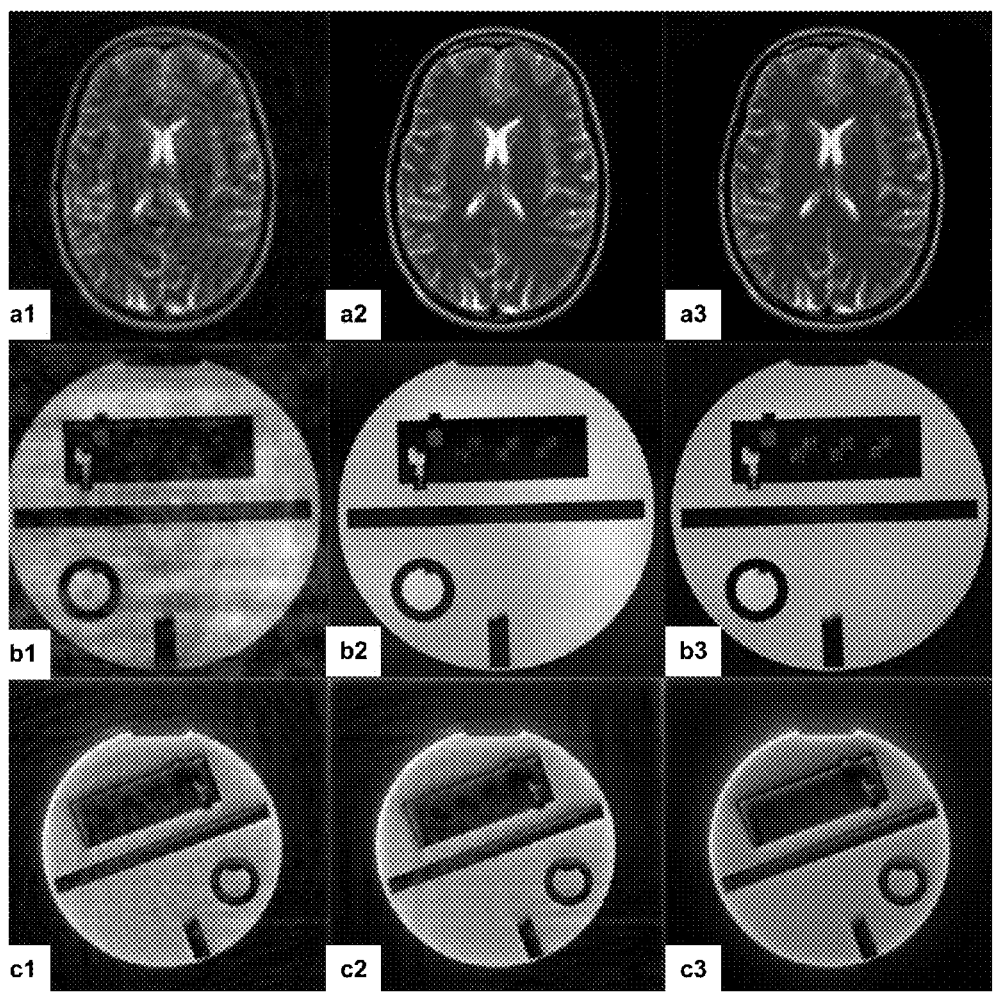
FIG. 8 is a matrix chart showing exemplary numerical phantom simulation results using traditional reconstruction, compressed sensing reconstruction in accordance with one or more exemplary embodiments, and fully sampled reconstruction.

FIG. 8 illustrates exemplary numerical phantom simulation results using traditional reconstruction, CS reconstruction using a multi-level variable-density spiral trajectory in accordance with an exemplary embodiment, and fully sampled reconstruction. Specifically, row (a) shows simulated image reconstruction for a brain. An exemplary multi-level spiral with 11 interleaves and 10 millisecond ("ms") readout contains aliasing artifacts using traditional reconstruction, as shown in FIG. 8 at (a1). An embodiment of the disclosed method using CS reconstruction, shown at (a2), has negligible artifacts compared to the fully sampled reconstruction, shown at (a3).

In the experiment shown in row (b), fully sampled Cartesian data (b3) was pseudo-undersampled at 12.4 percent to a gridded spiral trajectory. An embodiment of the disclosed method using CS reconstruction, shown at (b2), eliminated most artifacts apparent in the direct reconstruction, shown at (b1), and kept the structural details.

Row (c) shows a multi-level spiral experiment with 47 interleaves and 6 ms readout with a resolution of 0.5 millimeters ("mm"). The direct reconstruction is shown in (c1), while the result using an embodiment of the disclosed method using CS reconstruction is shown in (c2). The fully-sampled acquisition required 95 interleaves, shown in (c3).

Based on the experiment in row (a), the exemplary embodiment of a method for CS reconstruction achieved an acceleration rate of 5 without noticeable aliasing. It achieved similar results with an acceleration rate of 8 in the experiment in row (b). In the experiment in row (c), the non-uniform Fourier transform amplified the trajectory error in the iterative reconstruction, somewhat limiting its performance. As shown in (c2), the exemplary embodiment of a method for CS reconstruction achieved an acceleration rate of 2.

Discussion

The flexibility of variable-density spiral trajectories gives them unique advantages for optimal sampling pattern design for 2D CS. As demonstrated, embodiments of the disclosed systems and methods can be used to implement a theoretically optimal sampling pattern, and that this pattern may yield high acceleration rates for single-channel 2D acquisition with pseudo-undersampling.

CONCLUSION

The specific configurations, choice of materials and the size and shape of various elements can be varied according to particular design specifications or constraints requiring a system or method constructed according to the principles of the present disclosure. Such changes are intended to be embraced within the scope of the present disclosure. The presently disclosed embodiments, therefore, are considered in all respects to be illustrative and not restrictive. The scope of the present invention is indicated by the appended claims, rather than the foregoing description, and all changes that come within the meaning and range of equivalents thereof are intended to be embraced therein.

LIST OF REFERENCES

1. Lustig et al. MRM 2007; 58:1182.
2. Zhang et al. JMRI 2013.
3. Adcock et al. arXiv:1302.0561.
4. Qing et al. ISMRM 2011; 546.
5. Lustig et al. ISMRM 2005; 685.
6. Geurquin-Kern et al. IEEE Trans Med Imaging. 2012; 626-636.

What is claimed is:

1. A method for data sampling and image reconstruction, comprising:
    acquiring magnetic resonance data corresponding to an area of interest of a subject, wherein acquiring the magnetic resonance data comprises:
        determining a two-dimensional (2D) multi-level undersampling pattern based on:
            a distance, $r_k$, between each sampling point of a plurality of sampling points in k-space and a center of the k-space, and
            a probability that each of the sampling points is acquired;
        determining a desired variable-density spiral trajectory based on the multi-level undersampling pattern, wherein the desired variable-density spiral trajectory has a density according to a function of $r_k$;
        generating one or more spiral gradient waveforms based on the desired variable-density trajectory;
        tracing a variable-density spiral trajectory using the one or more spiral gradient waveforms; and
        sub-sampling the magnetic resonance data based on the variable-density spiral trajectory; and
    reconstructing, using one or more image reconstruction functions that comprise compressed sensing, one or more images of the area of interest based on the acquired magnetic resonance data.

2. The method of claim 1, further comprising determining a characteristic of a physiological activity in the area of interest of the subject based on the one or more reconstructed images.

3. The method of claim 2, wherein the physiological activity comprises a dynamic physiological activity.

4. The method of claim 2, wherein the area of interest of the subject comprises at least one of the brain and the heart of the subject.

5. The method of claim 1, wherein acquiring the magnetic resonance data further comprises receiving experimental image data from a scanner having a single-channel coil.

6. The method of claim 1, wherein sub-sampling the magnetic resonance data comprises undersampling the magnetic resonance data at about 10 percent or greater.

7. The method of claim 1, wherein sub-sampling the magnetic resonance data comprises undersampling the magnetic resonance data at about 12.4 percent.

8. The method of claim 1, wherein sub-sampling the magnetic resonance data comprises densely sampling the k-space proximate the center of the k-space and sparsely sampling the k-space proximate one or more edges of the k-space.

9. A method for image reconstruction, comprising:
acquiring magnetic resonance data corresponding to an area of interest of a subject, wherein acquiring the magnetic resonance data comprises:
determining a multi-level undersampling pattern based on:
a distance between each sampling point of a plurality of sampling points in k-space and a center of the k-space, and
a probability that each of the sampling points is acquired;
determining a desired variable-density spiral trajectory based on the multi-level undersampling pattern;
generating one or more spiral gradient waveforms based on the desired variable-density trajectory;
tracing a variable-density spiral trajectory using the one or more spiral gradient waveforms; and
sub-sampling the magnetic resonance data based on the variable-density spiral trajectory; and
reconstructing one or more images of the area of interest based on the acquired magnetic resonance data.

10. The method of claim 9, further comprising determining a characteristic of a physiological activity in the area of interest of the subject based on the one or more reconstructed images.

11. The method of claim 10, wherein the physiological activity comprises a dynamic physiological activity.

12. The method of claim 10, wherein the area of interest of the subject comprises at least one of the brain and the heart of the subject.

13. The method of claim 9, wherein reconstructing the one or more images comprises using one or more image reconstruction functions that comprise compressed sensing.

14. The method of claim 9, wherein the multi-level undersampling pattern is a two-dimensional (2D) multi-level undersampling pattern.

15. The method of claim 9, wherein acquiring the magnetic resonance data further comprises receiving experimental image data from a scanner having a single-channel coil.

16. The method of claim 9, wherein sub-sampling the magnetic resonance data comprises undersampling the magnetic resonance data at about 10 percent or greater.

17. The method of claim 9, wherein sub-sampling the magnetic resonance data comprises undersampling the magnetic resonance data at about 12.4 percent.

18. The method of claim 9, wherein sub-sampling the magnetic resonance data comprises densely sampling the k-space proximate the center of the k-space, and sparsely sampling the k-space proximate one or more edges of the k-space.

19. The method of claim 9, wherein the desired variable-density spiral trajectory has a density as according to a function of the distance between each sampling point of the plurality of sampling points in k-space and the center of the k-space.

20. A system for image reconstruction, comprising:
a data collection device configured to acquire magnetic resonance data corresponding to an area of interest of a subject, the data collection device comprising:
an undersampling determination module configured to determine a 2D multi-level undersampling pattern based on:
a distance, $r_k$, between each sampling point of a plurality of sampling points in k-space and a center of the k-space, and
a probability that each of the sampling points is acquired;
a trajectory determination module configured to determine a desired variable-density spiral trajectory based on the multi-level undersampling pattern, wherein the desired variable-density spiral trajectory has a density according to a function of $r_k$;
a generating module configured to generate one or more spiral gradient waveforms based on the desired variable-density trajectory;
a tracing module configured to trace a variable-density spiral trajectory using the one or more spiral gradient waveforms; and
a sampling module configured to sub-sample the magnetic resonance data based on the variable-density spiral trajectory; and
an image processing device coupled to the data collection device and configured to reconstruct, using one or more image reconstruction functions that comprise compressed sensing, one or more images of the area of interest based on the acquired magnetic resonance data.

21. The system of claim 20, wherein the data collection device comprises a magnetic resonance imaging (MRI) device configured to acquire the magnetic resonance data.

22. The system of claim 21, wherein the image processing device comprises at least one processor configured to execute computer-readable instructions to cause a computing device to perform functions comprising acquiring the magnetic resonance data and reconstructing the one or more images.

23. The system of claim 20, wherein the image processing device is further configured to determine a characteristic of a physiological activity in the area of interest of the subject based on the one or more reconstructed images.

24. The system of claim 23, wherein the physiological activity comprises a dynamic physiological activity.

25. The system of claim 23, wherein the area of interest of the subject comprises at least one of the brain and the heart of the subject.

26. The system of claim 20, wherein reconstructing the one or more images comprises using one or more image reconstruction functions that comprise compressed sensing.

27. The system of claim 20, wherein the multi-level undersampling pattern is a two-dimensional (2D) multi-level undersampling pattern.

28. The system of claim 20, wherein acquiring the magnetic resonance data further comprises receiving experimental image data from a scanner having a single-channel coil.

29. The system of claim 20, wherein sub-sampling the magnetic resonance data comprises undersampling the magnetic resonance data at about 10 percent or greater.

30. The system of claim 20, wherein sub-sampling the magnetic resonance data comprises undersampling the magnetic resonance data at about 12.4 percent.

31. The system of claim 20, wherein sub-sampling the magnetic resonance data comprises densely sampling the k-space proximate the center of the k-space, and sparsely sampling the k-space proximate one or more edges of the k-space.

32. A non-transitory computer-readable storage medium having stored computer-executable instructions that, when executed by one or more processors, cause a computer to perform functions comprising:
  acquiring magnetic resonance data corresponding to an area of interest of a subject, wherein acquiring the magnetic resonance data comprises:
    determining a multi-level undersampling pattern based on:
      a distance between each sampling point of a plurality of sampling points in k-space and a center of the k-space, and
      a probability that each of the sampling points is acquired;
    determining a desired variable-density spiral trajectory based on the multi-level undersampling pattern;
    generating one or more spiral gradient waveforms based on the desired variable-density trajectory;
    tracing a variable-density spiral trajectory using the one or more spiral gradient waveforms; and
    sub-sampling the magnetic resonance data based on the variable-density spiral trajectory; and
  reconstructing one or more images of the area of interest based on the acquired magnetic resonance data.

33. The non-transitory computer-readable storage medium of claim 32, wherein the instructions, when executed by the one or more processors, are further configured to cause the computer to determine a characteristic of a physiological activity in the area of interest of the subject based on the one or more reconstructed images.

34. The non-transitory computer-readable storage medium of claim 33, wherein the physiological activity comprises a dynamic physiological activity.

35. The non-transitory computer-readable storage medium of claim 33, wherein the area of interest of the subject comprises at least one of the brain and the heart of the subject.

36. The non-transitory computer-readable storage medium of claim 32, wherein reconstructing the one or more images comprises using one or more image reconstruction functions that comprise compressed sensing.

37. The non-transitory computer-readable storage medium of claim 32, wherein the multi-level undersampling pattern is a two-dimensional (2D) multi-level undersampling pattern.

38. The non-transitory computer-readable storage medium of claim 32, wherein acquiring the magnetic resonance data further comprises receiving experimental image data from a scanner having a single-channel coil.

39. The non-transitory computer-readable storage medium of claim 32, wherein sub-sampling the magnetic resonance data comprises undersampling the magnetic resonance data at about 10 percent or greater.

40. The non-transitory computer-readable storage medium of claim 32, wherein sub-sampling the magnetic resonance data comprises undersampling the magnetic resonance data at about 12.4 percent.

41. The non-transitory computer-readable storage medium of claim 32, wherein sub-sampling the magnetic resonance data comprises densely sampling the k-space proximate the center of the k-space, and sparsely sampling the k-space proximate one or more edges of the k-space.

* * * * *